United States Patent [19]
Valette et al.

[11] Patent Number: 5,321,786
[45] Date of Patent: Jun. 14, 1994

[54] PROCESS FOR THE HYBRIDIZATION AND POSITIONING OF AN OPTOELECTRONIC COMPONENT RELATIVE TO AN INTEGRATED OPTICAL GUIDE

[75] Inventors: Serge Valette, Grenoble; Michel Ravetto, Meyland; Gérard Destefanis, Saint Egreve, all of France

[73] Assignee: Commissariat A L'Energie Atomique, France

[21] Appl. No.: 106,547

[22] Filed: Aug. 16, 1993

[30] Foreign Application Priority Data

Aug. 14, 1992 [FR] France .............................. 92 10040

[51] Int. Cl.$^5$ .............................................. G02B 6/36
[52] U.S. Cl. ..................................... 385/92; 385/147; 359/900
[58] Field of Search ........................ 372/50, 109, 705; 29/840, 843, 860; 385/88, 89, 90, 91, 92, 93, 94, 14, 131, 132, 147; 359/900

[56] References Cited

U.S. PATENT DOCUMENTS

| | | | |
|---|---|---|---|
| 4,270,134 | 5/1981 | Takeda et al. | 357/19 |
| 4,861,128 | 8/1989 | Ishikawa et al. | 385/131 |
| 5,023,881 | 6/1991 | Ackerman et al. | 372/46 |
| 5,131,584 | 7/1992 | Boitel et al. | 228/180.2 |
| 5,230,030 | 7/1993 | Hartman et al. | 385/89 |

FOREIGN PATENT DOCUMENTS

2424685 11/1979 France .
2646558 11/1990 France .

OTHER PUBLICATIONS

Journal of Lightwave Technology, vol. 10, No. 3, Mar., 1992, New York, USA, pp. 336–340; E. E. L. Friedrich et al.: "Hybrid Integration of Semiconductor Lasers with Si-Based Single-Mode Ridge Waveguides".
Patent Abstracts of Japan, vol. 10, No. 41 (P-429) (2098) Feb. 18, 1986 & JP-A-60 188 913 (Matsushita Denki Sangyo K.K.) Sep. 26, 1985.
IEEE Transactions on Components, Hybrids, and Manufacturing Technology, vol. 13, No. 4, Dec., 1990, New York U.S., pp. 780–786; M. J. Wale et al.: "Self-Aligned Flip-Chip Assembly of Photonic Devices with Electric and Optical Connections".
Frequenz, vol. 45, No. 9–10, Sep. 1991, Berlin, DE, pp. 245–252, J. Muller et al.: "trench Bulge Waveguides for Integrated Optical Circuits".
Sensors and Actuators, vol. A23, No. 1–3, Mar., 1990, Lausanne, CH, pp. 1087–1091, S. Valette et al.: Silicon Based Integrated Optics Technology for Optical Sensor Applications.
L'Echo des Recherches No. 130, 1987, J. C. Bouley, pp. 59–68, "Evolution and Future Prospects of Laser Structures in Telecommunication", 1987.

Primary Examiner—Rodney B. Bovernick
Assistant Examiner—John Ngo
Attorney, Agent, or Firm—Pearne, Gordon, McCoy & Granger

[57] ABSTRACT

Process for the hybridization and positioning of an optoelectronic component on a substrate and application of this process to the positioning of a laser diode with respect to an optical guide. This process consists of forming on the substrate at least one abutment (16), which determines by fitting in at least one notch (34) formed on the component to be hybridized, the lateral positioning of said component, forming shims (24) on the substrate (6), whose height fixes the vertical positioning of the component (2), the latter being provided with pads or studs (32) of a first material, forming studs or pads (26) of a second material on the substrate, forming on the pads of the second material a welding chip (28) made from a meltable material able to wet in the melted state the first and second materials and not the area round them, positioning the component in contact with the welding chip in such a way that the abutment (16) is fitted into the notch (34) and the welding chip (28) faces the pad not provided with a chip, raising the assembly to the melting point of the chips and bringing the assembly to a temperature below the melting point thereof.

14 Claims, 6 Drawing Sheets

PROCESS FOR THE HYBRIDIZATION AND POSITIONING OF AN OPTOELECTRONIC COMPONENT RELATIVE TO AN INTEGRATED OPTICAL GUIDE

DESCRIPTION

The present invention relates to a process for the hydridization and positioning of an integrated optoelectronic component on a substrate and more specifically a process for the hybridization of an optoelectronic component having confined light guidance such as a laser diode and positioning said component with respect to the light guide, particularly having lateral confinement, integrated on the same substrate.

It is used in the field of integrated optics, particularly for the real time processing of signals, sensors and optical memories, as well as in the field of optical telecommunications.

The fitting of a laser diode to a substrate and its positioning with respect to a light guide is a fundamental problem in integrated optoelectronics for the following reasons:

the alignment precision of the diode and the light guide required must be below 0.5 micrometer, with the maximum possible optical coupling efficiency, semiconductor lasers are sensitive to the heat dissipation defects of the arrangements used and laser diodes have a behaviour which is sensitive to the light return phenomenon in the laser cavity by undesired light reflection, as soon as they are coupled with an external optical circuit, this being known as optical feedback, leading to instability.

The object of the invention is to in particular propose a solution to this problem, specifically in the case of a laser diode and an optical guide produced by integrated optical technologies on silicon.

In view of the fact that the said problem of integration on a substrate and positioning with respect to an optical guide is not linked with the laser diodes alone, but with all optoelectronic components, the invention aims in general terms at a process for the hybridization and positioning of an optoelectronic component with respect to a confined light optical guide. This optoelectronic component can be an integrated optical circuit or a radiation detector, said circuits and detectors being e.g. produced in III-V or II-VI or IV-VI technology.

The inventive hybridization and positioning process uses welding by a metal chip of the component on a substrate. This is known as flip-chip and is in particular described in FR-A 2 646 558.

The known method of welding by a metal chip does not permit a positioning accuracy of a component better than 1 to 3 micrometers. Thus, in these known procedures the accuracy of the alignment is determined by the dimensions of the welding chip. This precision is inadequate for the fitting of a laser diode or a component having planar or confined light guidance with respect to an optical guide.

The invention relates to a process for the hybridization and positioning of an optoelectronic component ensuring a positioning accuracy better than 0.5 micrometer.

More specifically the invention relates to a process for the hybridization and lateral and vertical positioning on a substrate of an integrated optoelectronic component having confined light guidance with respect to one end of an optical guide formed on said substrate and having a guiding core, the component having at least one stud or pad of a first material on a face to be hybridized, said process comprising:

forming on the substrate at least one abutment, whose upper part determines by fitting in at least one special notch, formed on the face of the component to be hybridized, the lateral positioning of said component, forming at least one shim on the substrate for supporting the component when welded thereto having a height fixing the vertical positioning of the component, forming at least one stud or pad of a second material on the substrate and which is displaced with respect to the shim, forming on the pad of the second or first material a welding chip made from a meltable material able to wet in the molten state the first and second materials and not the area around them, positioning the component in such a way that the abutment is fitted into the notch and the welding chip faces the pad not provided with a chip, heating the assembly to a temperature ensuring the melting of the chip and bringing the assembly to a temperature below the melting point of the material of the chip.

The substrate used can be made from glass, lithium niobate or silicon. Preference is given to silicon, which ensures as a result of its high thermal conductivity, the dissipation of the heat given off by the optoelectronic component and which is necessary for the satisfactory operation of said component. Moreover, the silicon-integrated optical technology based on the deposition of multilayers is appropriate for the definition of a self-alignment process.

The pads formed on the electronic component and on the substrate are generally metallic. Moreover, to ensure a good electrical insulation of said component, particularly when other optoelectronic components have to be hybridized on the same substrate, a thin electrically insulating layer can be provided between the substrate and the pads made from the second material and supported by the substrate. This layer can be of silica, silicon nitride or silicon oxynitride.

The welding material must have a low melting point like tin, indium, lead and metallic alloys based on tin, indium or lead and eutectics based on silicon such as Si-Au, Si-Sn, etc. They must ensure an excellent wettability on the pads. The first and second materials are more particularly made from a metal such as gold, platinum, palladium, etc.

Advantageously the second material has a surface which is larger than that of the chip and that of the pad of the first material so that it can function as a radiator and increases the exchange surface with the hybridization substrate, when the latter is a good heat dissipator (e.g. in the case of silicon).

When the component to be hybridized is produced on a substrate having a thermal conductivity higher than that of the substrate on which hybridization takes place, the surface of the first material will then be larger than that of the chip and the second material.

The hybridization process according to the invention can also utilize the surface tension forces at the time of welding in order to carry out the lateral positioning of the optoelectronic component. Thus, at the time of melting the welding material, the pad of the component and that of the substrate are self-aligned with the welding chip.

This effect facilitates the putting into place of the lateral abutments for a self-alignment with the core of the guide, with respect to the corresponding notches produced in a similar manner on the component to be hybridized.

Preferably, the height of the shims is less than the thickness separating the component from the substrate. The shims permit a precise vertical positioning of the optoelectronic component better than that obtained by using solely the thickness of the welding chip, as in the prior art referred to hereinbefore.

In order to improve the lateral positioning of the optoelectronic component, it is advantageous to form on the substrate, on either side of the chip, abutments intended for the lateral positioning of the component. In order to achieve the requisite positioning accuracy, said abutments must advantageously be "self-aligned" with the light microguide core. This means that in order to avoid positioning uncertainties due to the use of different masks for producing the upper part of the abutments and which is also used for said lateral alignment, and the core of the microguide, use is made of a single mask and the same etching stage for defining both elements.

This point becomes all the more fundamental as the topographies of the integrated optical circuits become very contorted (hollows and bosses of several $\mu$m) and make difficult the superimposings of sets of different masks to better than 1.5 or 2 $\mu$m.

Using a single mask, the different elements located on the mask can be aligned to within 0.1 $\mu$m (more particularly because the assembly of the different points of the mask takes place to scale 10).

In this case, it is preferable to produce in the component to be hybridized notches which are to be fitted onto the said abutments, said notches also being "self-aligned" with the guidance zone of the component and which e.g. forms the active part of the laser diode.

According to the invention, it is possible to use one or more welding chips associated with one or more pads of the first and second materials. In particular, the pads of the first material correspond to the electrodes of the component.

Advantageously use is made of chips, whose shape is a replica of the pads or electrodes of the first material of the optoelectronic component.

In particular, the chip is shaped like a band, whose length is adapted to that of the component. This is particularly true in the case of laser diodes or modulators made from III-V materials.

It is clear that there can be several parallel bands, particularly in the case of LiNbO$_3$ modulators generally having 2 or 3 electrodes.

Moreover, in order to ensure a good stability of the optoelectronic component, several shims are formed and are regularly distributed over the substrate in such a way as to be able to support the periphery of the component.

The invention more specifically applies to the hybridization and positioning on a substrate of an optoelectronic component having planar guidance and which is in particular light confined, such as a laser diode with respect to the end of an optical guide formed on a substrate.

In known manner, an optical guide has a core (or guiding ribbon) inserted between an upper layer and a lower layer of materials having a refractive index lower than that of the core. The upper layer can be air.

In this particular application, the shims are defined in at least the upper layer of the optical guide by etching said layer on either side of the ribbon. In addition, the second material pad is formed on the substrate in the extension of the guide and facing said end. The abutments used for the lateral positioning of the diode are defined by etching at least the upper layer of the guide on either side of the core.

According to the invention the upper portions of the abutments constituting the effective positioning zone are then advantageously produced at the same time as the optical guide, i.e. as stated hereinbefore, from a same etching stage using the same mask.

In silicon-integrated optical technology, the optical guide is formed in a OIS-type guide structure using silica layers.

In particular the guide structures used are of the type Si/SiO$_2$/Si$_3$N$_4$/SiO$_2$, designated OIS$_1$ or of the type Si/SiO$_2$/high index SiO$_2$/SiO$_2$, designated OIS$_2$.

The silica layers of structure OIS$_1$ and OIS$_2$ can be doped by a material reducing their refractive index such as boron or fluorine or can be doped by a material increasing their refractive index such as phosphorus, germanium, titanium or nitrogen.

Obviously, in order to obtain a guide structure, the ribbon material must have a refractive index higher than that of the confinement layers.

It is also possible to replace the silicon nitride by alumina or silicon oxynitride SiO$_x$N$_y$ with $0 \leq x \leq 2$, $0 \leq y \leq 4/3$ and $0 \leq x+y \leq 2$.

It is optionally possible to replace the silicon substrate by a silica or glass substrate, although the latter have a lower thermal conductivity.

The process described can also be performed with other light guide types, provided that they are formed from several superimposed layers obtained by various deposits or by epitaxy.

Advantageously use is made of a focusing lens at the guide end in order to facilitate the positioning of the component with respect to the end of the optical guide, whilst ensuring a good coupling between the component and the guide.

For example, for an OIS$_1$ structure, the positioning of a diode with respect to the guide, in the absence of the lens, must be to within 0.1 $\mu$m in height and between 0.5 and 1 $\mu$m in width, whereas the coupling (or light quantity received by the guide) between the diode and the guide is approximately 90%. This positioning constraint is due to the limited thickness of the guide ribbon. Due to the use of the lens, the height positioning can be between 0.5 and 1 $\mu$m with a >90% coupling.

For an OIS$_2$ structure, the coupling between a diode and an optical guide is only 10 to 15% with a 0.5 to 1 $\mu$m height positioning. This limited coupling results from the small index differences between the ribbon and the confinement layers and the divergence of the diode.

In order to increase this coupling, it would be necessary to place the diode in contact with the guide, which might damage the diode as a result of its fragility and would increase the light reflections on the guide, which again penetrate the diode thus disturbing its operation. A solution to this problem would be to use an insulator, but its use is incompatible with the hybridization method.

This problem is solved in the invention by the focusing lens. Thus, coupling increases up to 70% and the diode can be placed at a distance approximately twice the focal length of the lens, thus limiting the parasitic reflections on the guide and diode deterioration risks.

The invention is described in greater detail hereinafter relative to non-limitative embodiments and with reference to the attached drawings, wherein show.

Figure 1:
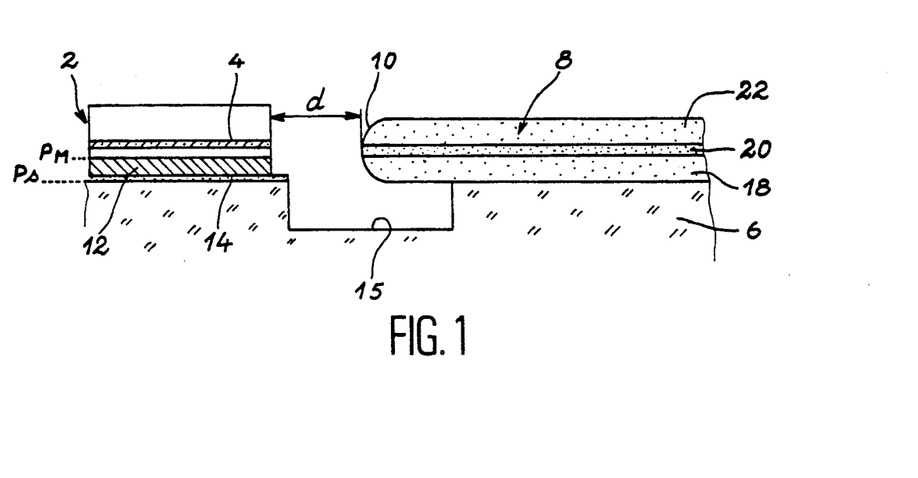
FIG. 1: Diagrammatically and in longitudinal section a laser diode and a light guide with an end lens, integrated on a same substrate and positioned with respect to one another.
Figure 2:
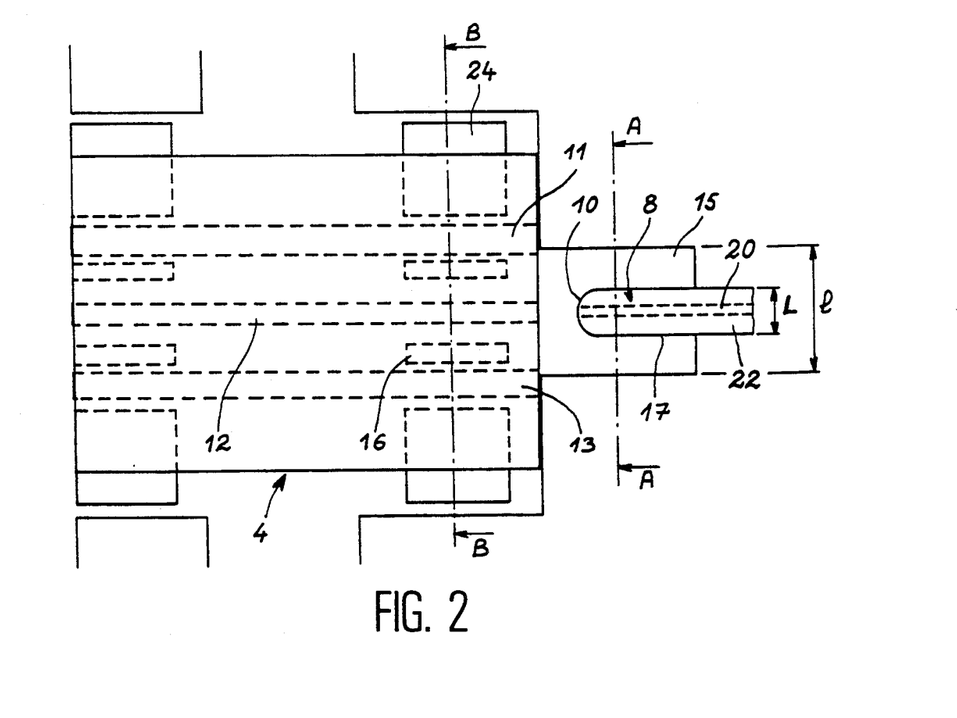
FIG. 2: A plan view of the arrangement of FIG. 1.

A description will now be given of the hybridization of a laser diode 2, as shown in FIGS. 1 and 2, equipped with a generally confined active zone 4 on a silicon substrate 6 and its positioning with respect to the end of a lateral confinement light guide 8 provided with a focusing lens 10. A lateral confinement light guide is referred to hereinafter as a microguide as opposed to a planar guide.

The diode 2 can be produced from III-V material, as described in the document "Evolution et perspective des structures lasers pour télécommunications" by J. C. Bouley, Echo des Recherches, no. 130, 4th Semester 1987, pp. 59 to 68 or in the document "Long wavelength conductor lasers" by G. P. Agraval and N. K. Dutto, Editions Van Nostrand Reinhold Cie, New York, 1986.

According to the invention, it is fixed e.g. by a metal weld 12 based on a eutectic, indium, lead and tin or a mixture of these materials. In order to electrically insulate the diode 2 from the substrate 6, an electrical insulating layer 14 can optionally be placed between the substrate 6 and the diode.

In an OIS structure, said insulant 14 can appropriately be 10 to 500 nm thick silica. However, it is also possible to use $Si_3N_4$ or a polyimide.

As shown in FIGS. 1 and 2, the lens 10 is formed above a recess 15 made in the substrate. The lens is quasi-hemispherical and has a diameter of 5 to 50 $\mu$m whilst the recess has a width 1 of 15 to 200 $\mu$m and a depth exceeding the guide width. Moreover, the distance d separating the lens from the diode is approximately twice the focal length of the lens.

Figure 6:
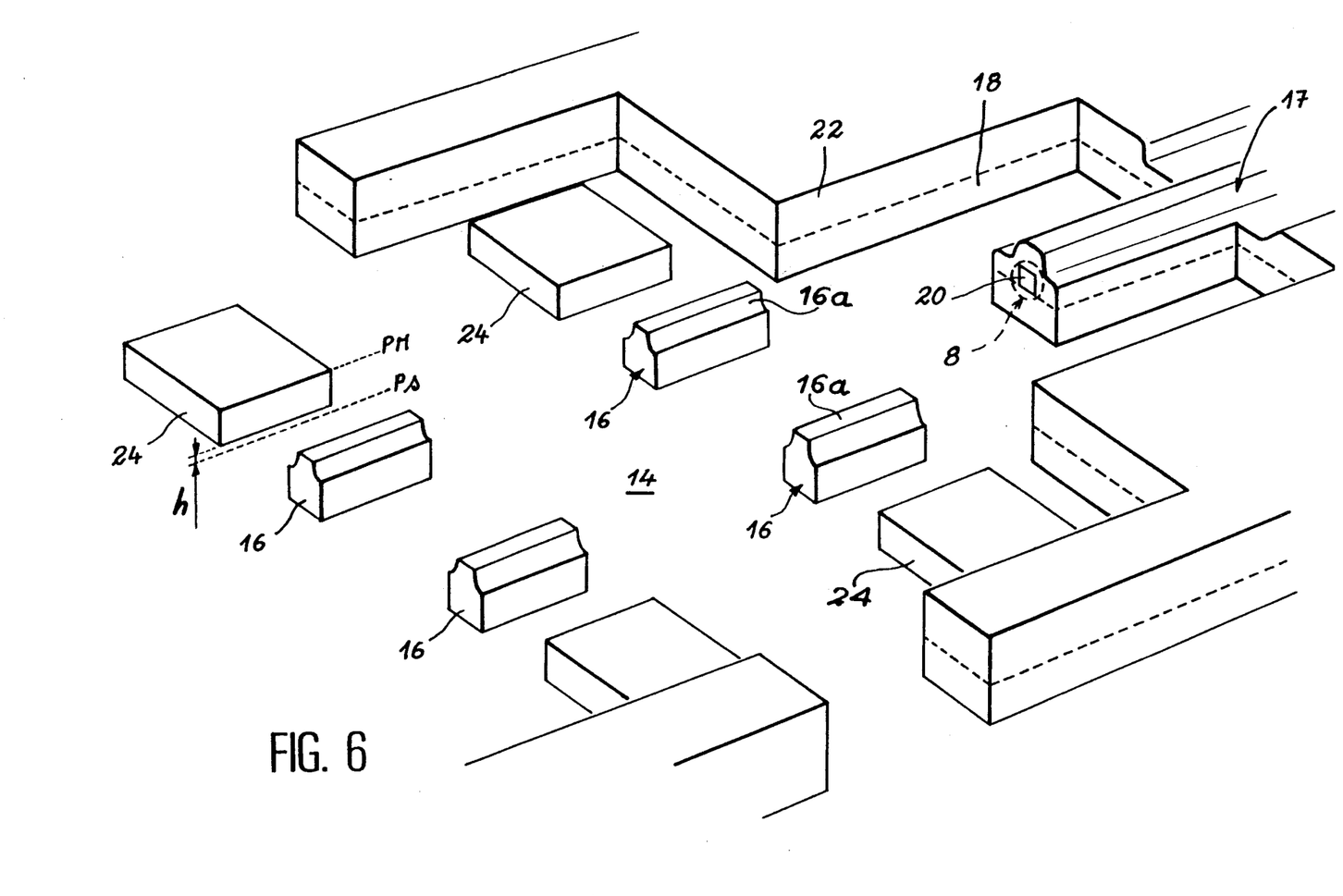

In order to avoid a light information loss in the guide 8 the lens is formed at the end of a tongue 17 having transverse dimensions L at least equal to those of the volume occupied by the guided light (cf. FIG. 6). This tongue e.g. has a length of 20 to 200 $\mu$m.

The hemispherical shape at the end of the tongue is obtained by the local melting thereof, e.g. by focusing on said zone of a $CO_2$ laser.

FIG. 2 shows the abutment 16 ensuring a lateral positioning of the diode with respect to the end lens 10 of the waveguide 8. These abutments 16 are appropriately of silica in the OIS structure. It is also possible to use a polyimide. They are self-positioned relative to the microguide 8.

In the $OIS_2$ structure, the guide 8 has a buffer silica layer 18, a high refractive index silica guide layer 20 and an upper silica confinement layer 22. The silica may or may not be doped with dopants decreasing or increasing its refractive index in such a way that the layer 20 has a refractive index higher than that of the confinement layers 18 and 22.

Typically, the layers 18 and 22 are of 4 to 15 $\mu$m thick, not intentionally doped silica and the layer 20 is of 0.5 to 8 $\mu$m thick, silica doped with ions increasing its index.

As shown in FIG. 2, the welding of the diode 2 can be ensured solely with the aid of a central weld 12 or with the aid of said weld 12 and two lateral welds 11 and 13 also ensuring the stabilization of the diode during its hybridization. The periphery of the diode 2 also rests on shims 24, which are appropriately made from silica in the OIS structure. However, it is also possible to use a polyimide, $Si_3N_4$ or $Al_2O_3$.

Figure 3:
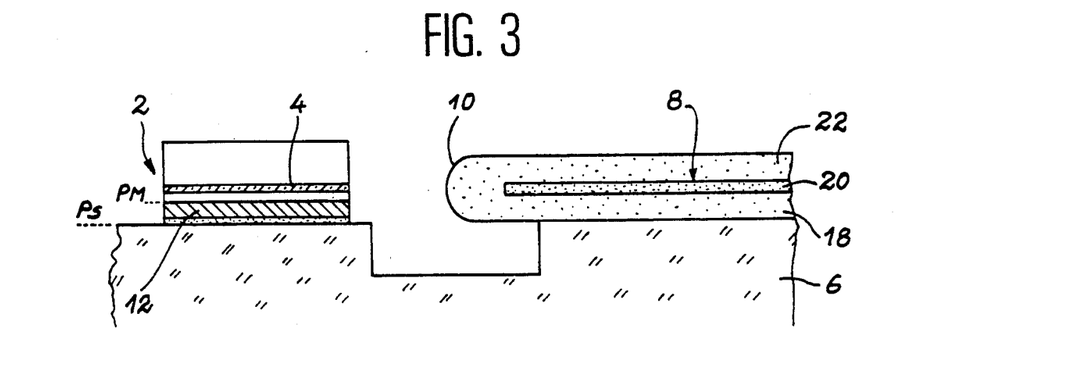
FIG. 3: A variant of the diode-guide arrangement of FIG. 1.

The arrangement of FIG. 3 differs from that of FIGS. 1 and 2 by the nature of the guide structure. In this case, the guide core 20 is made from a material having a high refractive index such as $Al_2O_3$, $Si_3N_4$ or $SiO_xN_y$. In this case, the silica layers 18 and 22 respectively have a thickness of 2 to 10 $\mu$m and 1 to 5 $\mu$m and the core layer 20 has a thickness of 50 to 1000 nm.

Figure 4:
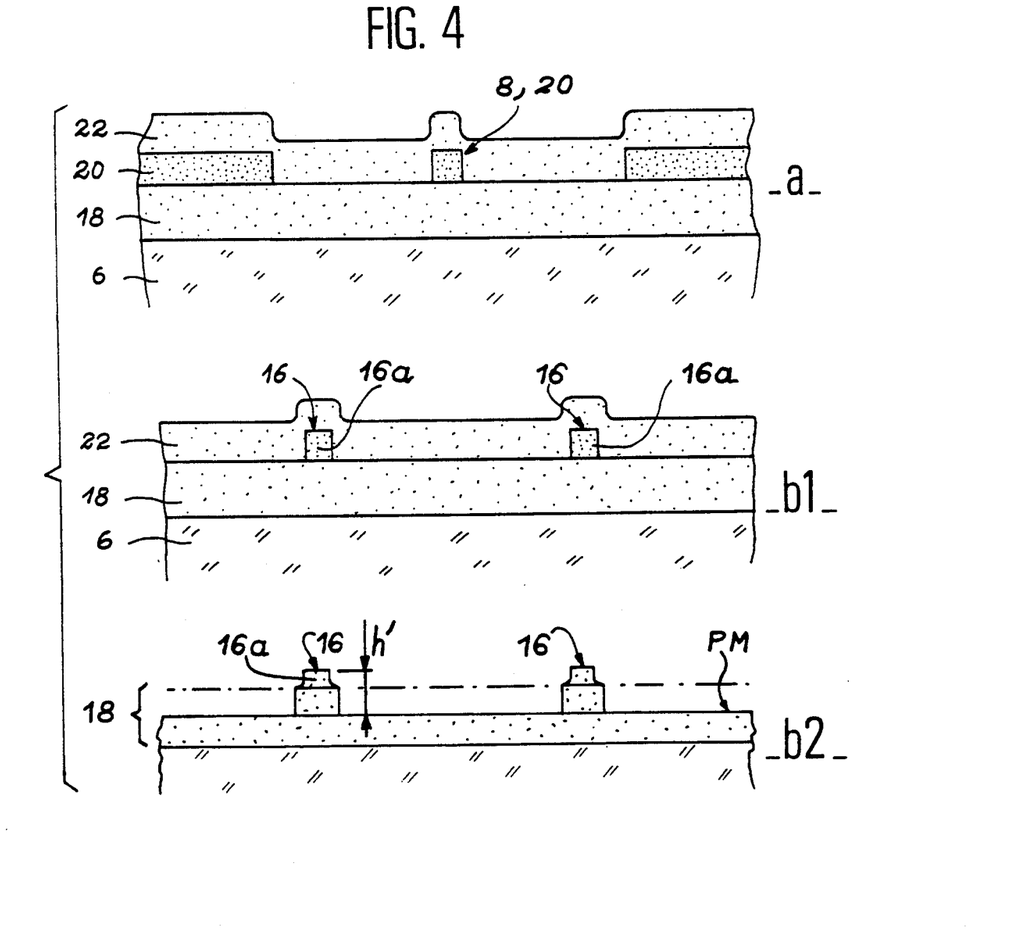
FIGS. 4 to 9: Diagrammatically the different stages of "self-alignment" and hybridization of the diode of FIG. 1 with respect to the light guide, FIGS. 4, 7 and 9 being cross-sectional views, FIG. 5 a plan view of the different etching masks used and FIGS. 6 and 8 perspective views.

The first stage of producing the arrangement of FIGS. 1 and 2 comprises, as shown in FIG. 4, depositing the silica and high index silica layers 18 and 20 on the substrate 6 using the chemical vapour deposition (CVD) method, which may or may not be plasma assisted (PECVD). The portions a and $b_1$ of FIG. 4 are cross-sections along line A—A and B—B of FIG. 2 and portion $b_2$ thereof is a section along line B—B of FIG. 2.

This is followed by an etching of the layer 20 so as to form the core of the guide 8, as well as the upper portion 16a of the abutments 16. This etching is performed by the dry route advantageously using the same mask M1 shown in continuous line from in FIG. 5.

This stage is the key stage of the lateral "self-alignment" process of the guide core and abutments and consequently for the perfect positioning of said core with the active zone of the component.

This is followed by the deposition of the upper confinement layer 22 on the structure obtained, as shown in FIG. 4, using CVD or PECVD.

Figure 5:
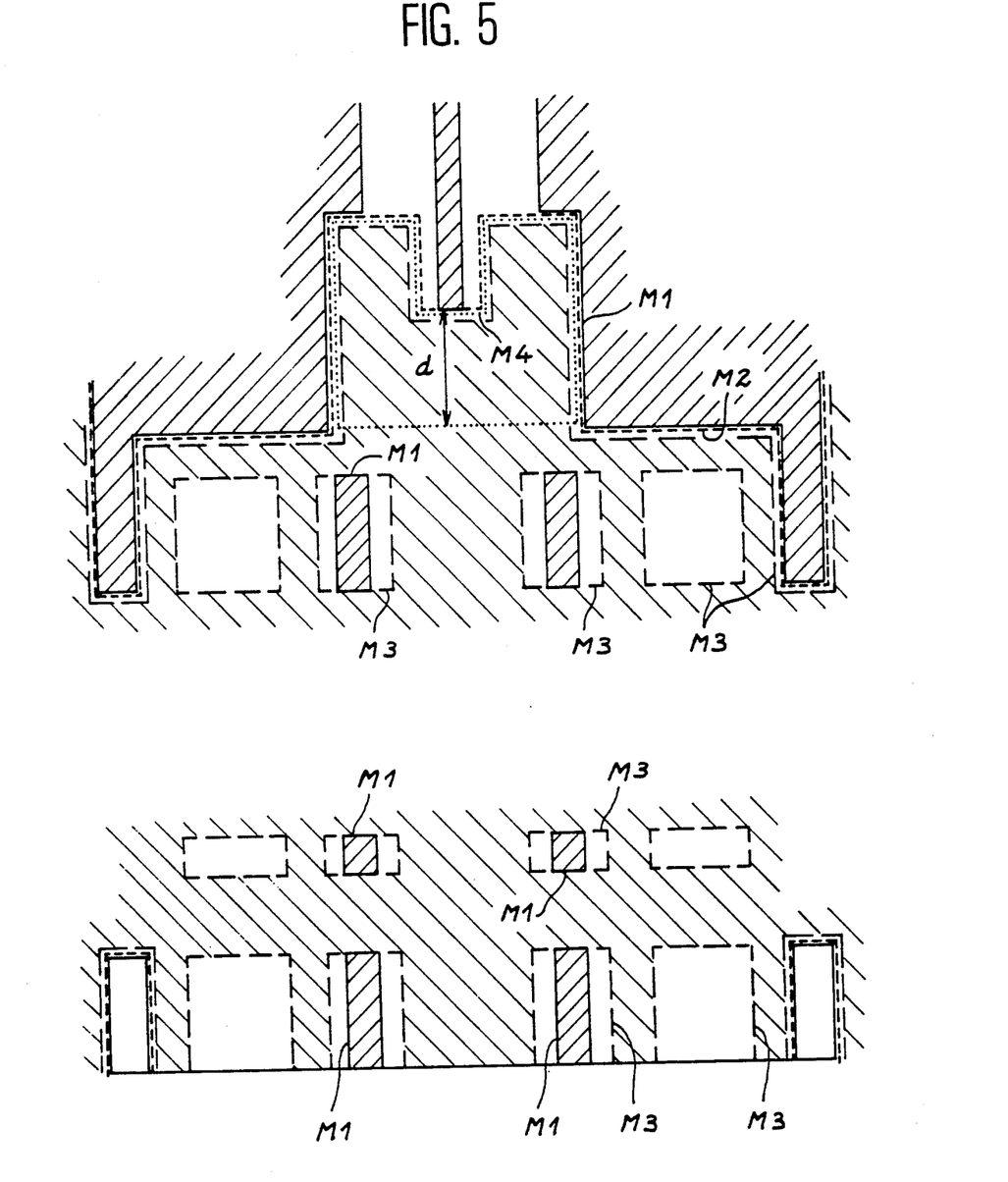

With the aid of the mask M2 shown by means of short lines in FIG. 5, the guide structure is etched so as to define the plane PM or reference level on which will rest the laser diode during the final stage of its hybridization, as well as the shape of the tongue 17 and the abutment 16.

In the case shown in the drawings, this plane PM is defined by etching the silica layer 22, optionally the layer 20 over their entire length and optionally a portion of the layer 18 (as is the case on portion $b_2$ of FIGS. 4 and 6). Thus, this etching defines the upper surface of the shims 24, as shown in FIG. 6, defining the height positioning of the diode.

The depth of said etching is determined by the respective heights of the guide cores and the diode to be hybridized with respect to the reference plane of the two respective components.

Following the two etching operations using the masks M1 and M2, the abutments are completed and their height h' is approximately the same as the thickness of the optical microguide.

This is followed by an etching of the structure with the aid of the mask M3 shown in long dotted lines in FIG. 5, fixing the location and dimensions of the shims 24, those of the lower portions of the abutment 16 and the dimensions of the end of the optical guide 8, which will support the lens 10. Following said etching operation, the structure is that of FIG. 6.

Figure 7:
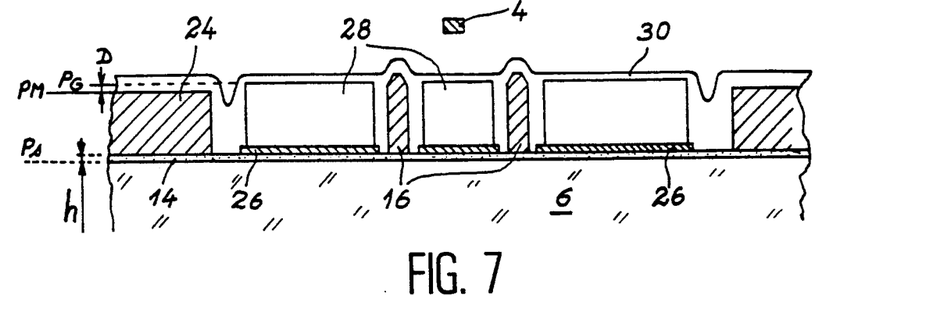

This etching can directly reach the substrate if the latter is of an insulating nature or if there is no need to electrically insulate the different connections (rare case). Most frequently, said etching is stopped above the substrate in order to maintain a thin insulant layer 14 of thickness h (FIG. 7). This layer will usually be of silica.

These two last stages use masks M2 and M3, which can be reversed by slightly modifying the masks M2 and M3. With the mask M3, e.g. etching takes place of the complete structure, whilst leaving a thickness h of insulant 14 before reaching the substrate and protecting the future shims 24 and abutment 16. The reference plane PM is then defined with the mask M2.

Figure 8:
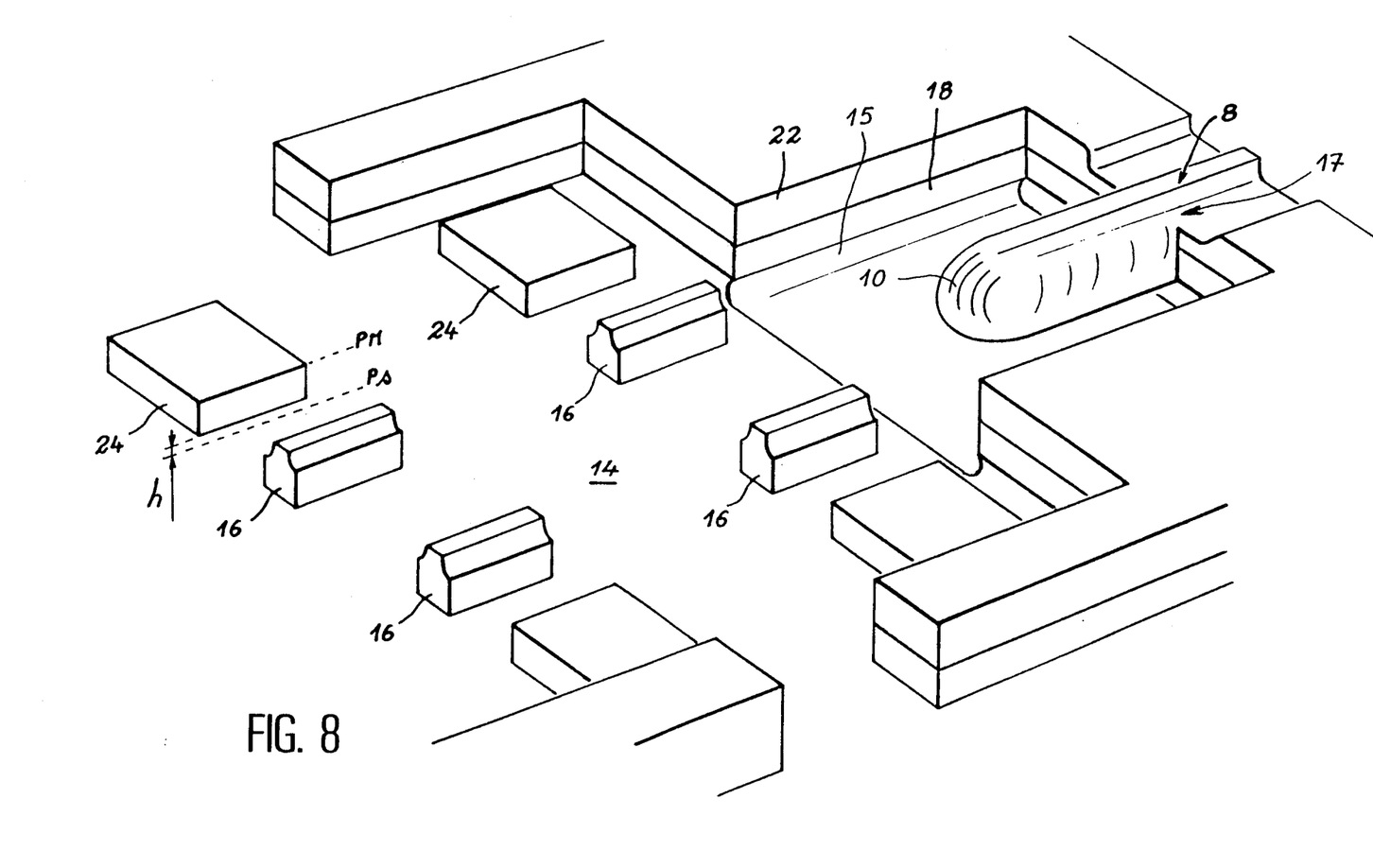

FIGS. 6 and 8 correspond to the first procedure (M2 before M3).

The following stage of the process is shown in FIG. 7, which is a cross-sectional view in direction B—B of FIG. 6.

Successive deposition takes place of two metal layers 26, 28 on the complete structure and having respective thicknesses 0.2 to 2 μm and 3 to 50 μm in an examplified manner. The surface of the layer 28 defines the plane PG located at a level above the plane PM with respect to the plane of the substrate PS.

The difference D separating the plane PG from the plane PM is at least equal to the production uncertainty of these two planes. Thus, D is chosen in such a way as to take account of this uncertainty and PG is always above the plane PM. In practice, D is chosen between 0.5 and 5 micrometers.

This is followed by an etching of the layers 26 and 28, so as to define the welding chips 28 and the contact zones 26 of the substrate side. The welding chips 28 are made from a material with a low melting point such as indium. This material is able to wet, in the melted state, the remaining metal 26 and does not wet the insulant 14 exposed during the etching of the chips and the contact zones, the latter being more particularly of gold.

The following stage of the process consists of depositing on the complete structure a protective layer 30, which is in particular of silica and has a thickness of 0.5 to 2 μm, which is etched with the aid of the mask M4 so that it has an opening facing the guide 8 fixing the dimensions of the substrate recess 15.

This is followed by an isotropic etching of the substrate in order to free the tongue 17, whose end is to support the lens 10, said etching e.g. being a microwave etching (typical frequency 45 GHz) using the reactive gases Ar, $SF_6$ and $O_2$. It is carried out over a thickness greater than the width of the guide. This is followed by the elimination of the silica protective layer 30.

The lens 10 is obtained by melting the end of the tongue 17 with the aid of a laser illumination at a wavelength absorbed by the silica such as the emission at 10.6 μm of a $CO_2$ laser or that of a short wavelength laser (<230 nm). This illumination takes place from above, either perpendicularly to the substrate plane, or with an inclination with respect thereto.

FIG. 8 is a perspective view of the final structure after producing the recess 15 in the substrate and the end lens 10.

In the case where the temperature produced by the laser illumination could cause a deterioration of the welding chips 28 and the wetting zones 26, it is possible to produce the end lens 10 prior to the deposition of the metal layers. When the metal layers are deposited prior to the production of the lens, the deposition of the protective layer 30 must be carried out at a low temperature, so as to prevent the metal 28 from melting.

It is also possible to place between the metal layers 26, 28 and the protective layer 30 a photosensitive resin layer, which will facilitate the removal of said protective layer at the end of lens production.

Figure 9:
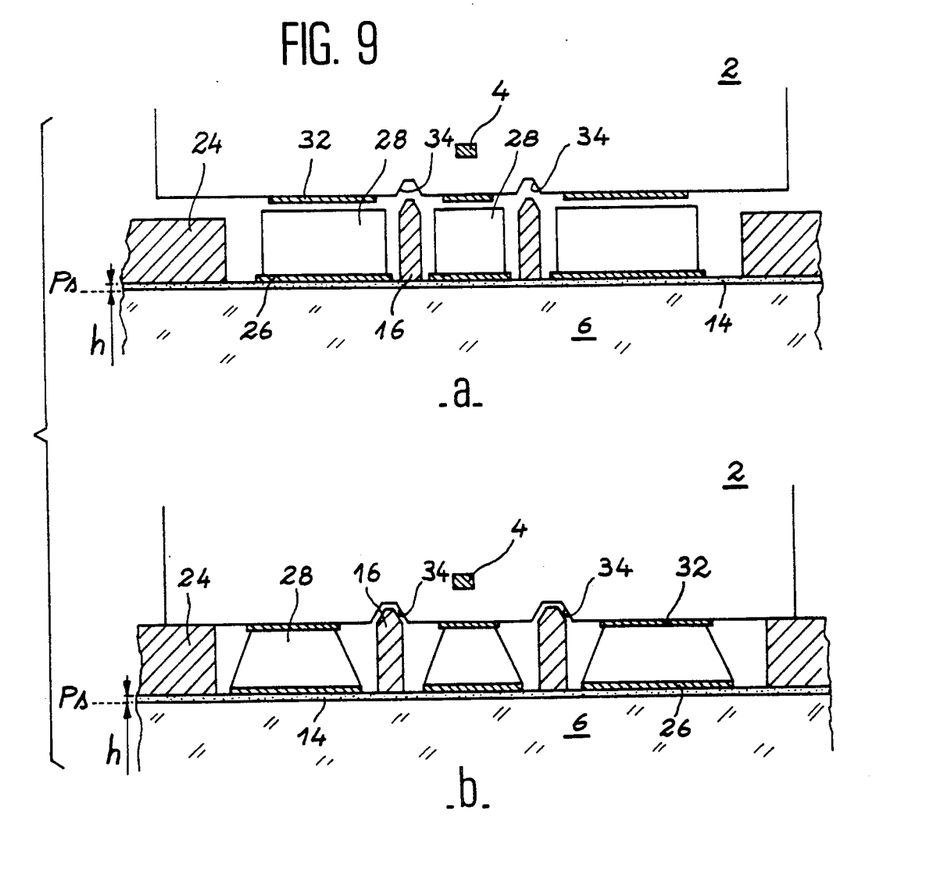

The following stages of the process relate to the hybridization of the diode, as shown in FIG. 9. For this purpose the diode 2 has metal pads 32 on its lower face and which are to be welded via the welding chips 28. These pads 32 are made from a metal which can be wetted by the welding material and in particular gold. Obviously the number of pads 32 of the diode corresponds to the number of metal pads 26, each equipped with a welding chip 28.

In order to ensure a correct lateral positioning of the diode by means of the abutment 16, it must have notches 34 for fitting onto the abutment 16. Portion a of FIG. 9 represents the positioning of the diode prior to welding and portion b the positioning of the diode after welding.

The production of the notches 34 must take place in an identical manner to that of the pads 16, i.e. by means of a "self-alignment" process with the guiding zone of the component to be hybridized and in this case the emissive zone 4 when a laser diode is used.

At the time of welding, as a result of the surface tensions, the pads 32 and 26 self-position in automatic manner ensuring the fitting of the upper portion 16a of the abutment 16 in the notches 34 and the perfect alignment of the emissive zone 4 and the guide core 20, as a result of their respective auto-positioning with respect to the notches and the abutments.

After melting, the welding pads are crushed and assume the shape shown in portion b of FIG. 9, so that the lower surface of the diode 2 bears on the shims 24.

In order to ensure a large heat exchange surface on the side of the substrate 6, which serves as a radiator during the operation of the diode, it is of interest to produce the metal pads 26 in such a way that their surfaces are larger than those of the pads 32.

The surfaces of the pads 26 and 32 are determined in such a way that during the melting of the welding chips 28, the surface plane PG of the chips can be lowered and assume a position below the plane PM. This is what would happen if the shims 24 did not exist. The final vertical position of the diode is reached as soon as its lower surface rests on the shims 24.

The invention is based on the fact that the effect of the surface tension forces can come into play just before the diode 2 rests on the shims 24. Once this position is reached, the frictional forces involved no longer permit such an easy utilization of the surface tension forces, which is explained by the fact that the plane PG must be above the plane PM.

In the opposite case, prior to welding, on the shims 24 and the frictional forces would prevent use being take of the surface tension forces for the lateral alignment of the diode 2 and the automatic fitting of the pads 16 in the notches 34.

We claim:

1. Process for the hybridization and lateral and vertical positioning on a substrate of an integrated optoelectronic component having confined light guidance with respect to one end of an optical guide formed on said substrate and having a guiding care, the component having at least one stud or pad of a first material on a face to be hybridized, said process comprising:

forming on the substrate at least one abutment upper part that determines the lateral positioning of said component by fitting in at least one special notch formed on the face of the component to be hybridized, forming at least one shim on the substrate for supporting the component when welded thereto having a height fixing the vertical positioning of the component, forming at least one stud or pad or a second material on the substrate and which is displaced with respect to the shim, forming on the pad of the second or first material a welding chip made from a meltable material able to wet in the molten state the first and second materials and not the area around them, positioning the component in such a way that the abutment is fitted into the notch and the welding chip faces the pad not provided with a chip, heating the assembly to a temperature ensuring the melting of the chip and bringing the assembly to a temperature below the melting point of the material of the chip.

2. Process according to claim 1, characterized in that the height of the shim is less than the thickness separating the component from the substrate.

3. Process according to claim 1, characterized in that the abutments are defined by the etching of at least the upper portion of the guide on either side of the core of the guide.

4. Process according to claim 3, characterized in that the abutments are produced at the same time as the optical guide and by using the same mask fixing the dimensions of the upper portions of the abutments and those of the guide core.

5. Process according to claim 1, characterized in that the notches are formed so as to be self-aligned with the guidance zone of the component.

6. Process according to claim 1, characterized in that a focusing lens is produced at the end of the guide.

7. Process according to claim 1, characterized in that the second material pad has a surface larger than that of the chip and that of the first material pad.

8. Process according to claim 1, characterized in that the chip is shaped like a band, whose length is matched to that of the component.

9. Process according to claim 1, characterized in that the second material is metallic.

10. Process according to claim 9, characterized in that an electrical insulant is placed between the substrate and the second material pad.

11. Process according to claim 1, characterized in that the guide has a guiding core placed between a lower layer and upper layer of materials having a refractive index lower than that of the core.

12. Process according to claim 11, characterized in that the upper layer, lower layer and core are of silica, which may or may not be doped, in such a way that the refractive index of the core is higher than that of the upper and lower layers.

13. Process according to claim 11, characterized in that the upper or lower layers are of doped or undoped silica and the core is of $SiO_xN_y$ with $0 \leq x < 2$, $0 \leq y \leq 4/3$ and $0 < x+y \leq 2$, of $Al_2O_3$ or $Si_3N_4$.

14. Process according to claim 1, characterized in that formation takes place of several shims distributed over the substrate so as to support the periphery of the component.

* * * * *